United States Patent [19]
Ono

[11] Patent Number: 5,966,606
[45] Date of Patent: Oct. 12, 1999

[54] METHOD FOR MANUFACTURING A MOSFET HAVING A SIDE-WALL FILM FORMED THROUGH NITRIDATION OF THE GATE ELECTRODE

[75] Inventor: Atsuki Ono, Tokyo, Japan

[73] Assignee: NEC Corporation, Tokyo, Japan

[21] Appl. No.: 08/856,001

[22] Filed: May 14, 1997

[30] Foreign Application Priority Data

May 20, 1996 [JP] Japan .................................. 8-125046

[51] Int. Cl.[6] .......................... H01L 21/336; H01L 21/31; H01L 21/469

[52] U.S. Cl. .......................... 438/303; 438/305; 438/775; 438/776

[58] Field of Search ................................... 438/303, 305, 438/307, 775, 776

[56] References Cited

U.S. PATENT DOCUMENTS

| | | |
|---|---|---|
| 4,356,623 | 11/1982 | Hunter . |
| 5,119,152 | 6/1992 | Mizuno .................................. 357/23.3 |
| 5,371,028 | 12/1994 | Koh ............................................ 437/43 |
| 5,382,550 | 1/1995 | Iyer ........................................ 437/235 |
| 5,424,232 | 6/1995 | Yamauchi ................................. 437/43 |
| 5,493,138 | 2/1996 | Koh ........................................ 257/314 |

FOREIGN PATENT DOCUMENTS

| | | |
|---|---|---|
| 0 015 694 | 9/1980 | European Pat. Off. . |
| 0 550 255 A2 | 7/1993 | European Pat. Off. . |
| 4-297037 | 10/1992 | Japan . |
| 08 17936 | 1/1996 | Japan . |
| 2 273 605 | 6/1994 | United Kingdom . |

OTHER PUBLICATIONS

Shimizu et al., "Advanced Ion Implantation and Rapid Thermal Annealing Technologies for Highly Reliable 0.25um Dual Gate CMOS", IEEE Symposium on VLSI Technology Digest of Technical Papers (1996).

Togo et al., "Novel Deep Sub–Quarter Micron PMOSFETs with Ultra–shallow Junctions Utilizing Boron Diffusion from Poly–Si/Oxide (BDSOX)", IEEE Symposium on VLSI Tech. Digest of Tech. Papers (1994).

Primary Examiner—Richard A. Booth
Attorney, Agent, or Firm—Foley & Lardner

[57] ABSTRACT

A side-wall film of a gate electrode is fabricated as a two-layer structure including an underlying thin silicon nitride film and a relatively thick silicon oxide film. The silicon nitride film covers and protects the edge of the gate oxide film against formation of a gate bird's beak at the edge of the gate oxide film. The side-wall contacts with the silicon substrate substantially at the thick silicon oxide film of the side-wall, which prevents formation of a carrier trap area adjacent to the channel area. The bottom of the side-wall may be a nitride-doped silicon oxide instead.

4 Claims, 4 Drawing Sheets

METHOD FOR MANUFACTURING A MOSFET HAVING A SIDE-WALL FILM FORMED THROUGH NITRIDATION OF THE GATE ELECTRODE

BACKGROUND OF THE INVENTION (a) Field of the Invention:

The present invention relates to a method for manufacturing a MOSFET having a side-wall film and, more particularly, to an improvement of electric characteristics of a MOSFET having a side-wall film.

(b) Description of the Related Art:

It is generally indispensable to form individual semiconductor elements in a smaller size for obtaining a higher integration in a ultra large-scale semiconductor integrated circuit (ULSI) and for improving the ULSI to have multiple functions.

In the MOSFETs which are dominant among the current semiconductor elements, a shallow junction structure for the source/drain regions and a thin structure for the gate oxide film are developed for obtaining a short channel MOSFET having a sufficient function.

In a 256 Mbit DRAM, which is a typical example for the current ULSI, the transistor dimension is reduced down to as low as 0.25 $\mu$m, whereas the film thickness in the gate oxide film is reduced down to as low as 6 nm to 6.5 nm. In the development of such a miniaturization of the MOSFETs, the ratio of the dimension of the gate edge to the total gate length becomes larger and larger.

During the fabrication process for the MOSFET, the thin gate oxide film is generally exposed at the edges or sides of the gate structure after an etching step for configuring the gate structure. The exposed edge of the gate oxide film is then re-oxidized to have a larger thickness in the edge portion thereof by the subsequent cleaning step or heat treatment step for forming another oxide film at a high temperature.

The influence of the increased edge thickness of the gate oxide film on the transistor characteristic may be neglected so long as the gate structure has a relatively thick gate oxide film or a large gate length. However, the increased edge thickness of the gate oxide film due to the re-oxidation cannot be neglected in the ULSI wherein an extremely thin gate oxide film and an extremely small gate length are required.

In addition, the fact that the gate electrode is made of polycrystalline silicon (polysilicon) is one of the factors that reveal the problem in electrical characteristics of the MOSFETs, because the polysilicon film is more readily oxidized than monocrystalline silicon.

FIGS. 1A to 1D show consecutive steps for manufacturing a MOSFET by a conventional method. In FIG. 1A, a gate oxide film 12 and a polysilicon film 13 are formed on a silicon substrate 11. The polysilicon film 13 is etched for patterning selectively from the gate oxide film 12 by using an anisotropic etching technique using a photoresist film 18 as a mask. The entire oxide film 12 is left just after the etching step of the gate electrode 13 and is etched away by a subsequent removing step or cleaning step of the photoresist film at the region other than the region underlying the gate electrode 12. After the etching step of the oxide film 12, the edges of remaining film portion acting as a gate insulator film 12 is exposed at the side-wall of the gate structure, as shown in FIG. 1B.

Another oxide film 14 is then deposited on the entire surface by a CVD process using silane (SiH4) and $N_2O$ as a source gas (FIG. 1C). The CVD is effected under a relatively high substrate temperature, for example, at 800° C., for improvement of the step coverage of the resultant silicon oxide film 14.

During the CVD) step, the exposed edge of the gate oxide film 12 is oxidized due to the high substrate temperature and the oxidizing ambient to form a gate bird's beak 15 of the gate oxide film 12 at the edge potion of the gate oxide film 12, as shown in FIG. 1C. The deposited oxide film 14 is then etched back by an anisotropic etching step to leave the side-wall film for the gate structure (FIG. 1D).

The gate bird's beak 15 forms a local thick portion in the gate oxide film 12 and functions to locally raise the threshold voltage of the MOSFET. The local rise in the threshold voltage causes an increase of the on-resistance or parasitic resistance of the MOSFET as a whole. Consequently, the current of the MOSFET is slightly lowered to thereby degrade the electric characteristics of the MOSFET.

The thickness of the gate bird's beak sensitively depends on the process temperature, ambient and parameter, and accordingly, the control or suppression of the gate bird's beak is extremely difficult. That is, the on-current of the MOSFET cannot be accurately controlled to a design value due to the presence of the gate bird's beak, although the precise control is generally required in the MOSFET.

In order to suppress the gate bird's beak, such a gate structure may be considered wherein the side-wall film of the gate structure is made of silicon nitride whereby deposition of the silicon nitride for the side-wall can be effected in a non-oxidizing atmosphere. In this case, two methods may be inferred. FIG. 2 shows a first comparative method in which a single silicon nitride film is deposited as the side-wall film 17. FIG. 3 shows a second comparative method in which a two-layer side-wall structure is provided including a silicon nitride film 17A and an overlying silicon oxide film 16A.

The silicon nitride film 17 or 17A, however, involves problems in electrical characteristics of the MOSFET. Specifically, the silicon nitride film 17 or 17A forms a trap area 19 at the boundary between the silicon nitride film 17 or 17A and the silicon substrate 11, as shown in FIGS. 2 and 3. The underlying silicon nitride film 17A in FIG. 3 has a bottom or base having a length which is substantially equal to the length of the bottom of the single silicon nitride film 17 which is in contact with the silicon substrate 11 in FIG. 2. Accordingly, the trap areas 19 in FIGS. 2 and 3 are substantially identical. The trap area 19 involves an increase of the parasitic resistance, variation of electrical characteristics of the MOSFET to degrade the MOSFET properties. In addition, the silicon nitride film 17 or 17A has a larger Young's modulus compared to the silicon oxide film to thereby increase the stress at the edge of the gate structure and interface between the silicon nitride film 17 or 17A and the silicon substrate 11, which also causes a structural failure in the MOSFET. Further, the silicon nitride has a relative permittivity of 7.4 which is considerably higher than the relative permittivity (3.9) of silicon oxide, thereby increasing the parasitic capacitance between the gate electrode and source/drain to retard the operational speed of the MOSFET.

SUMMARY OF THE INVENTION

It is an object of the present invention to provide a method for manufacturing a MOSFET having a side-wall film for a gate structure wherein generation of the gate bird's beak is suppressed to thereby obtain improved electrical and mechanical characteristics for the MOSFET.

The present invention provides a method for manufacturing a metal-oxide field effect transistor (MOSFET) comprising the steps of forming a first silicon oxide film on a silicon substrate, forming a gate electrode on the first silicon oxide film, selectively removing the first silicon oxide film to leave a portion of the first silicon oxide film, which is in contact with the gate electrode, forming a first side-wall film made of silicon nitride on a side-wall of the gate electrode, forming a second side-wall film made of silicon oxide on the first side-wall film, forming source and drain regions in the silicon substrate adjacent to the gate electrode.

The present invention also provides another method for manufacturing a metal-oxide semiconductor field effect transistor (MOSFET) comprising the steps of forming a first silicon oxide film on a silicon substrate, forming a silicon gate electrode on the first silicon oxide film, nitriding a surface of the silicon gate electrode and an exposed portion of the first silicon oxide film to form a silicon nitride film and a nitrogen-doped silicon oxide film, respectively, forming a second silicon oxide film on the silicon nitride film and nitrogen-doped silicon oxide film, selectively etching the second oxide film, silicon nitride film and nitrogen-doped silicon oxide film to form a side-wall layer on a side-wall of the silicon gate electrode.

In accordance with the present invention, the silicon nitride film of the two-layer side-wall structure, which generally forms a trap area for trapping the carriers in the channel region of the silicon substrate, has only a limited area for the interface between the same and the silicon substrate to thereby reduce the trap area. Accordingly, degradation in the electrical characteristics of the MOSFET, such as increase in on-resistance or reduction in an operational speed, can be prevented. In addition, the silicon oxide film of the two-layer side-wall structure has a better step coverage and accordingly has a mechanical stability in a minute MOSFET to maintain the mechanical strength of the MOSFET.

PREFERRED EMBODIMENTS OF THE INVENTION

Figure 1A:
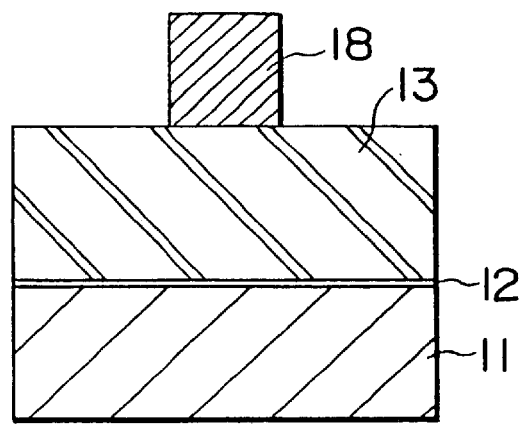
FIGS. 1A to 1D show a cross section of a semiconductor device in consecutive steps of a conventional fabricating process therefor.
Figure 1B:
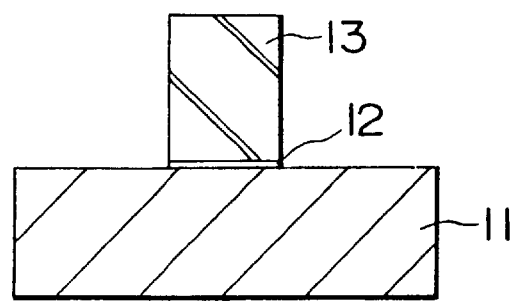
Figure 1C:
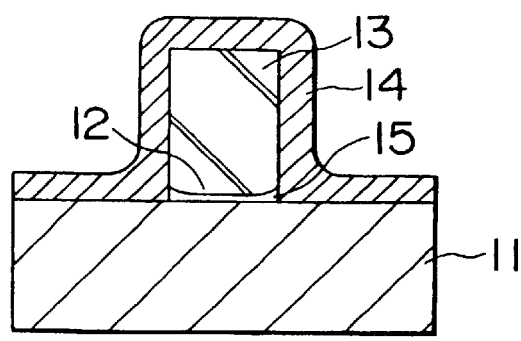
Figure 1D:
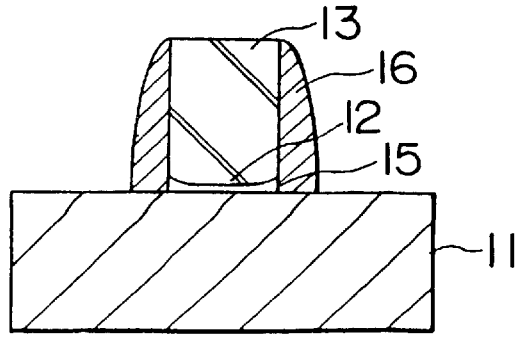
Figure 2:
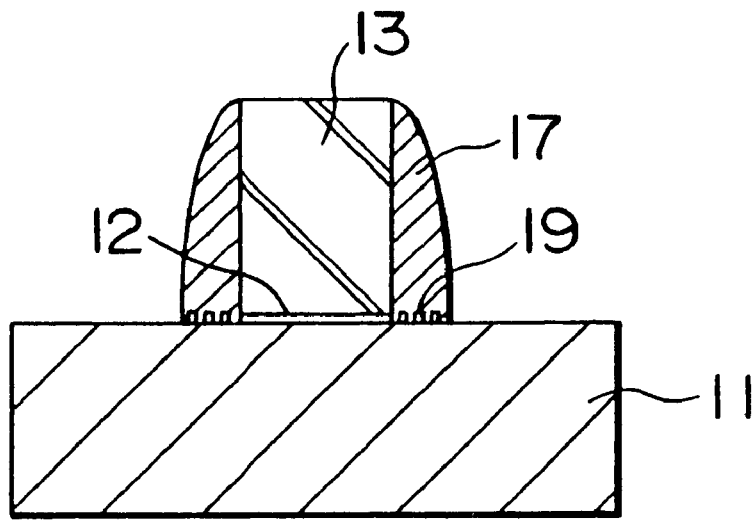
FIG. 2 is a cross-sectional view of a semiconductor device manufactured by a first comparative method.
Figure 3:
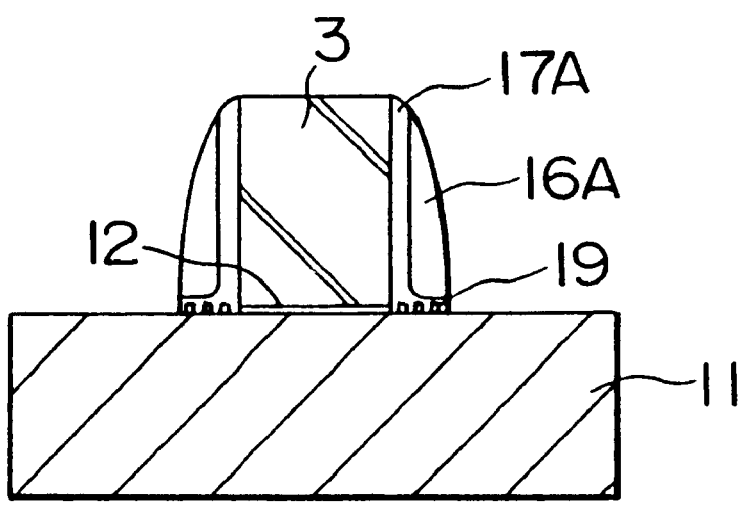
FIG. 3 is a cross-sectional view of a semiconductor device manufactured by a second comparative method.

Now, the present invention will be more specifically described based on preferred embodiments thereof with reference to the accompanying drawings, wherein similar constituent elements are designated by the same or similar reference numerals.

Figure 4A:
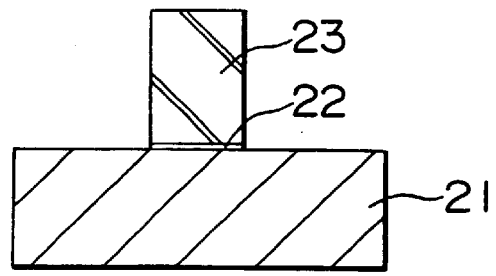
FIGS. 4A to 4E show a cross section of a semiconductor device in consecutive steps of a fabrication process according to a first embodiment of the present invention.

FIGS. 4A to 4E show a process according to a first embodiment of the present invention. In FIG. 4A, silicon substrate 21 has therein a P-well (not specifically shown in the figure) in each field area separated by a field oxide film from other field area. In the field area, a gate oxide film 22 is formed on the silicon substrate 21, followed by deposition of a polysilicon film. Provided that design rule for the MOSFET is 0.15 $\mu$m and the source voltage is designed at 2.0 volts, the gate oxide film 22 is around 5 nm thick. The gate oxide film 22 is formed by a thermal oxidation in a dry oxygen ambient, for example, at a temperature of 900° C. for about six minutes. The polysilicon film is deposited to a thickness between 200 nm and 300 nm by a chemical vapor deposition (CVD) using, for example, $SiH_4$ or $Si_2H_6$ as a source gas at a substrate temperature of about 600° C.

Subsequently, a resist pattern is formed by using an electron beam exposure technique, and the polysilicon film is patterned by an anisotropic etching technique using the electron beam resist as a mask to configure a gate electrode 23. The anisotropic etching is effected under the condition of a high selectivity of polysilicon film to silicon oxide film. Thereafter, the electron beam resist is removed together with the gate oxide film 22 in the region where the polysilicon film 23 is etched away to thereby obtain the structure of FIG. 4A.

Subsequently, a nitriding step is effected on the entire surface in a nitrogen ambient to form silicon nitride film on an exposed silicon surface by a lamp anneal apparatus using a halogen lamp. The nitriding process may be effected at a temperature between 900 and 1100° C. for about 30 seconds in an atmospheric pressure. Although the nitriding process is conducted at such a high temperature, it is only effected for a short length of time, and accordingly, the profile of boron ions constituting the impurity doped in the channel region does not change during the nitriding step. That is, the electrical characteristics of the MOSFET do not change significantly after the nitriding step. The nitriding process in the specific condition provides a silicon nitride film having a thickness between about 2 nm and 4 nm depending on the location where the nitride film is formed, i.e., depending on the surface of the polysilicon film 23 or silicon substrate 21.

Figure 4B:
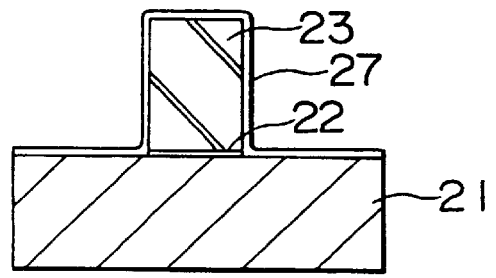

The silicon nitride film 27 is formed on portions of the silicon substrate 21 where the gate structure is not formed and on the surface of the polysilicon film 23 of the gate structure. In addition, the exposed edge of the gate oxide film 22 is also entirely covered by the silicon nitride film 27 due to the nitriding of the silicon oxide film 22 itself and due to the volume expansion caused by the nitriding of the polysilicon film 23. FIG. 4B shows the step after the nitriding process.

Figure 4C:
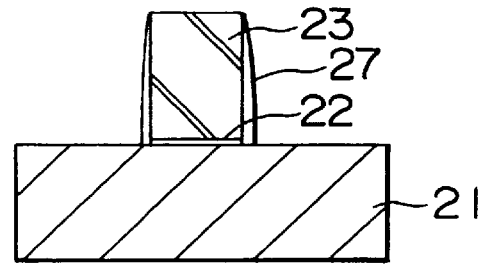

Thereafter, the silicon nitride film 27 is selectively etched by an anisotropic etching step to leave the silicon nitride side-wall film 27 only on the side-wall of the gate structure. In the anisotropic etching step for the silicon nitride film 27, the silicon nitride film 27 need not be left on the entire surface of the side-wall of the gate structure, but may be left only at the bottom portion of the side-wall. Specifically, an over-etching condition may be employed to thereby remove the silicon nitride film 27 from the top portion of the side-wall. If the nitrogen film 27 is removed from the top portion to expose the polysilicon film, it is not critical to the present invention because it is the exposed edge of the gate oxide film 22 that must be covered by the silicon nitride film 27. FIG. 4C shows the step after the anisotropic etching of the silicon nitride film 27.

Figure 4D:
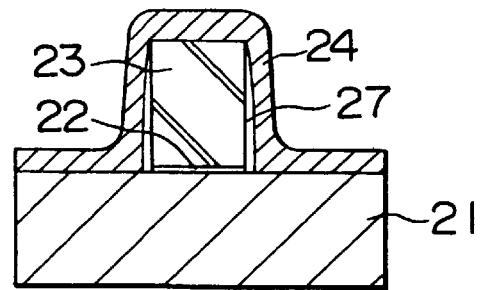

Subsequently, another oxide film 24 is deposited to a relatively large thickness between 100 nm and 150 nm by a CVD process, which process generally provides a sufficient step coverage property to the resultant film, at a relatively high temperature for a better step coverage. The CVD step is effected at a substrate temperature of about 800° C. and by using silane (SiH$_4$) and N$_2$O as a source gas. In the CVD step, the silicon substrate including the overlying films is exposed to an oxidizing ambient and a high temperature, which might generate gate bird's beak in a conventional method. However, since the gate oxide film 22 is already covered by the silicon nitride side-wall film 27 in the present embodiment, the increase in the thickness of the gate silicon oxide film 22 at the edge portion does not arise. FIG. 4D shows the step after the CVD process.

Figure 4E:
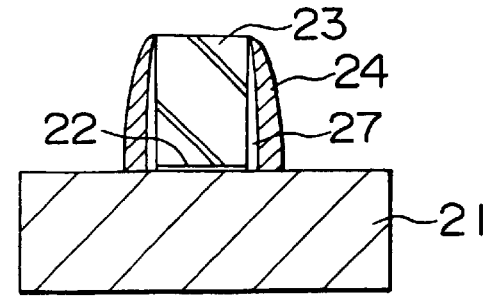

The CVD silicon oxide film 24 is then selectively etched by another anisotropic etching process to leave the silicon oxide side-wall film 24 only on the side-wall of the gate structure, as shown in FIG. 4E.

Subsequent steps in the present embodiment are similar to the steps in a conventional process. Specifically, arsenic (As) ions are introduced by an ion-implantation technique to the source/drain regions of the silicon substrate 21, followed by a heat treatment for thermal diffusion of As ions. Another oxide film having a sufficient flatness is deposited on the entire surface, followed by forming through-holes therein for source, drain and gate electrode. Then, a metallic film such as aluminum (Al) film is sputtered on the another oxide film, and patterned to form Al interconnects, thereby completing the process for the MOSFET.

FIGS. 5A to 5D consecutively show a semiconductor device in a fabrication process according to a second embodiment of the present invention. A field area and P-well for a MOSFET region not specifically shown in the figures are formed in a silicon substrate 21 by using a known method. A gate oxide film 22 is then formed on the silicon substrate 21 by a thermal oxidation, followed by deposition of a polysilicon film. The gate oxide film 22 has a thickness of 5 nm, for example. The thermal oxidation for forming the gate oxide film 22 is effected at a substrate temperature of about 900° C. for about six minutes. The polysilicon film is deposited to a thickness between 200 nm and 300 nm by a CVD process using SiH$_4$ or Si$_2$H$_6$ as a source gas at a substrate temperature of about 600° C.

Subsequently, a resist pattern is formed by using an electron beam exposure technique and the polysilicon film is patterned by an anisotropic etching technique using the resist pattern as a mask to configure a gate electrode 23. The anisotropic etching of the polysilicon film is effected under the condition of a high selectivity of polysilicon to silicon oxide. Thereafter, the resist pattern is removed while leaving the silicon oxide film 22 on the entire surface of the silicon substrate 21 to obtain the structure of FIG. 5A.

Subsequently, a nitriding step is effected onto the entire surface in a nitrogen ambient by a lamp anneal apparatus using a halogen lamp, so as to form a silicon nitride film 27. The nitriding step is effected at a temperature between 900 and 1100° C. for about 10 to 30 seconds in an atmospheric pressure using only nitrogen. Although the nitriding step is conducted at such a high temperature, it is only for a short time, and accordingly, the profile of boron ions constituting the impurity ions doped in the channel region does not change in the nitriding step. That is, the electrical characteristics of the transistor do not change significantly during the nitriding step. The nitriding process under the specified condition provides a silicon nitride film 27 on the polysilicon film 23 having a thickness between about 2 nm and 4 nm. The nitriding process also changes the exposed portion of the silicon oxide film 22 into a nitrogen-doped silicon oxide film 32.

Accordingly, after the nitriding step, the polysilicon film 23 of the gate structure is covered by the silicon nitride film 27, and the surface of the silicon substrate 21 including source/drain regions is covered by the nitrogen-doped silicon nitride film 32.

Figure 5A:
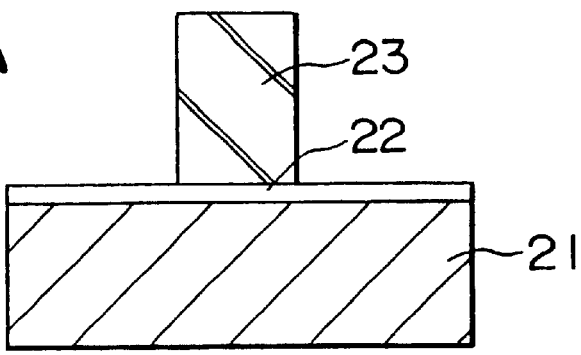
FIGS. 5A to 5D show a cross section of a semiconductor device in consecutive steps of a fabrication process according to a second embodiment of the present invention.
Figure 5B:
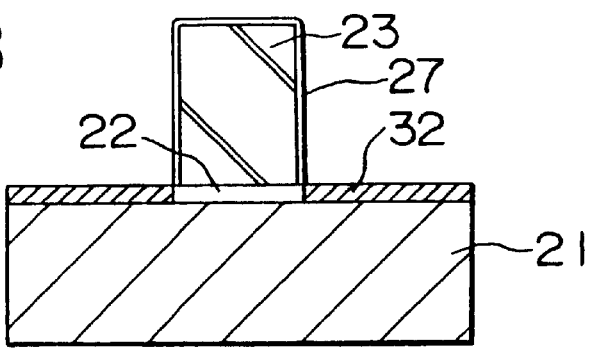
Figure 5C:
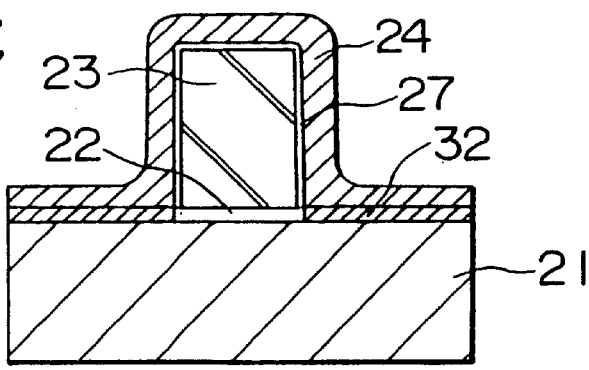
Figure 5D:
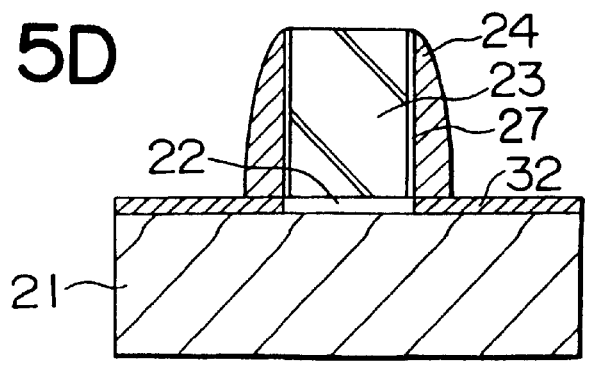

Subsequently, another silicon oxide film 24 is deposited on the entire surface to a relatively large thickness between 100 nm and 150 nm by a CVD process, which generally provides a sufficient step coverage property to the resultant film, at a relatively high temperature for a better step coverage. The CVD Process is effected at a substrate temperature of about 800° C. and by using silane (SiH$_4$) and N$_2$O as a source gas. In the CVD step, the silicon substrate 21 including the overlying films is exposed to an oxidizing ambient and subjected to a high temperature heat treatment, which might cause troubles in the gate oxide film 22 in a conventional process. However, since the edge of the gate oxide film 22 is not exposed to the oxidizing ambient, the increase in the thickness of the gate oxide film at the edge portion does not arise. FIG. 5C shows the step after the CVD process. The CVD silicon oxide film 24 is then selectively etched by another anisotropic etching process to leave the silicon oxide side-wall film 24 only on the side-wall of the gate structure, as shown in FIG. 5D.

Subsequent steps are similar to the steps of a conventional process. Specifically, As ions are introdced by an ion-implantation technique to a source/drain regions, followed by heat treatment for diffusion of As ions. Another oxide film having a sufficient flatness is deposited on the entire surface, forming through-holes therein for source, drain and gate electrode, metallic layer such as Al is sputtered on the another oxide film, and the metallic layer is patterned to complete a MOSFET.

Although the present invention is described with reference to preferred embodiments thereof, the present invention is not limited thereto and various modifications or alterations can be easily made therefrom by those skilled in the art without departing from the scope of the present invention.

What is claimed is:

1. A method for manufacturing a metal-oxide semiconductor field effect transistor (MOSFET) comprising the steps of forming a first silicon oxide film on a silicon substrate, forming a silicon gate electrode on said first silicon oxide film, nitriding an exposed surface of said silicon gate electrode and an exposed portion of said first silicon oxide film to form a silicon nitride film and a nitrogen-doped silicon oxide film, respectively, forming a second silicon oxide film on said silicon nitride film and nitrogen-doped silicon oxide film, and selectively etching said second silicon oxide film, said silicon nitride film and nitrogen-doped silicon oxide film to form a side-wall structure on a side-wall of said silicon gate electrode.

2. A method for manufacturing a MOSFET as defined in claim 1 wherein said nitriding step is effected at a temperature between 900° C. and 1100° C.

3. A method for manufacturing a MOSFET as defined in claim 1 wherein said nitriding step is effected by a lamp anneal under an atmospheric pressure.

4. A method for manufacturing a MOSFET as defined in claim 1 wherein said second silicon oxide film forming step includes a chemical vapor deposition using SiH$_4$ or Si$_2$H$_6$ as a source gas.

* * * * *